(12) United States Patent
Liu et al.

(10) Patent No.: US 7,322,015 B2
(45) Date of Patent: Jan. 22, 2008

(54) SIMULATING A DOSE RATE EVENT IN A CIRCUIT DESIGN

(75) Inventors: Harry H. L. Liu, Plymouth, MN (US); Keith W. Golke, Minneapolis, MN (US); Eric E. Vogt, Minneapolis, MN (US); Michael S. Liu, Bloomington, MN (US)

(73) Assignee: Honeywell Internatinal Inc., Morristown, NJ (US)

( * ) Notice: Subject to any disclaimer, the term of this patent is extended or adjusted under 35 U.S.C. 154(b) by 390 days.

(21) Appl. No.: 11/029,308

(22) Filed: Jan. 5, 2005

(65) Prior Publication Data

US 2006/0145086 A1    Jul. 6, 2006

(51) Int. Cl.
    *G06F 17/50*    (2006.01)
    *G06G 7/62*     (2006.01)
(52) U.S. Cl. .............................................. 716/4; 703/14
(58) Field of Classification Search .................... 716/1, 716/3–4, 2; 703/13–14
See application file for complete search history.

(56) References Cited

U.S. PATENT DOCUMENTS

| | | | | |
|---|---|---|---|---|
| 4,130,892 A | * | 12/1978 | Gunckel et al. | 365/154 |
| 4,225,797 A | * | 9/1980 | Fredrickson | 327/187 |
| 4,766,482 A | * | 8/1988 | Smeltzer et al. | 257/352 |
| 4,800,299 A | * | 1/1989 | Hayward | 327/509 |
| 4,876,583 A | * | 10/1989 | Hughes et al. | 257/352 |
| 5,391,931 A | * | 2/1995 | Larner | 307/117 |
| 5,396,169 A | | 3/1995 | Buehler et al. | 324/158.1 |
| 5,841,293 A | * | 11/1998 | Leas | 324/765 |
| 5,861,634 A | * | 1/1999 | Hsu et al. | 257/48 |
| 6,269,277 B1 | * | 7/2001 | Hershenson et al. | 700/97 |
| 6,275,080 B1 | * | 8/2001 | Phan et al. | 327/200 |
| 7,039,566 B2 | * | 5/2006 | Koike | 703/2 |
| 7,100,131 B2 | * | 8/2006 | Honda | 716/4 |

OTHER PUBLICATIONS

Nitin Mohan, "Radiation Effects on Electronic Devices," Project Report E & CE 709, http://www.ece.uwaterloo.ca/nn2mohan/rad.pdf, printed Sep. 28, 2004.
C. Barnes and L. Selva, "Radiation Effects in MMIC Devices," http://www.parts.jpl.nasa.gov/mmic/10.pdf, printed Oct. 5, 2004.

(Continued)

*Primary Examiner*—Stacy Whitmore
(74) *Attorney, Agent, or Firm*—McDonnell Boehnen Hulbert & Berghoff LLP

(57) ABSTRACT

Behaviors of a transistor during a dose rate event can be modeled using a circuit simulation software package. A subcircuit model replaces a transistor in a circuit design to be simulated. The subcircuit model can be in the form of a schematic-based representation or a netlist. The subcircuit model provides a model of a source junction and a drain junction in the transistor during the dose rate event. The subcircuit model also includes the size of the transistor being replaced and the dose rate of the dose rate event. Once the transistor is replaced with the subcircuit model, a dose rate simulation may be performed to determine the dose rate hardness of the circuit design.

23 Claims, 4 Drawing Sheets

600

602 → .subckt px d g s b

604 → Ip1 d b pulse (0 doserate*w*l*3.2e-18 10ns 2ps 2ps 100ns 120ns)

606 → dx1 b d d1

608 → In2 b s pulse (0 doserate*w*l*3.2e-18 10ns 2ps 2ps 100ns 120ns)

610 → dx2 b s d1

612 → .model d1 d(is=w*4e-20)

614 → mp1 d g s b p w=1 u=0.15u

616 → .ends px

OTHER PUBLICATIONS

Military Handbook, Dose-Rate Hardness Assurance Guidelines, MIL-HDBK-815, Nov. 7, 1994.

International Search Report for PCT/US2005/046508 dated Jul. 6, 2006.

Tor A. Fjeldly et al., "Modeling of High-Dose-Rate Transient Ionizing Radiation Effects in Bipolar Devices," IEEE Transaction on Nuclear Science, IEEE Service Center, New York, NY, U.S., vol. 48, No. 5, Oct. 2001.

Pouget V., et al., "Spice Modeling of the Transient Response of Irradiated MOSFETs", Radiation and its Effects on Components and Systems, 1999. RADECS 99. 1999 Fifth European Conference on Sep. 13-17, 1999, Piscataway, NJ, U.S.A., IEEE Sep. 13, 1999, pp. 69-74.

Yanqing Deng et al., "Spice Modeling of Double Diffused Vertical Power MOSFETs Exposed to Gamma Radiation," Semiconductor Device Research Symposium, 2004 International Dec. 10-12, 2003, Piscataway, NJ, U.S.A. IEEE, Dec. 10, 2003, pp. 138-139.

* cited by examiner

```
502 — .subckt nx d g s b
504 — In1 d b pulse (0 doserate*w*l*3.2e-18 10ns 2ps 2ps 100ns 120ns)
506 — dx1 b d d2
508 — In2 s b pulse (0 doserate*w*l*3.2e-18 10ns 2ps 2ps 100ns 120ns)
510 — dx2 b s d2
512 — .model d2 d(is=w*1.6e-19)
514 — mn1 d g s b n w=1u l=0.15u
516 — .ends nx
```

Fig. 5

```
602 — .subckt px d g s b
604 — Ip1 d b pulse (0 doserate*w*l*3.2e-18 10ns 2ps 2ps 100ns 120ns)
606 — dx1 b d d1
608 — In2 b s pulse (0 doserate*w*l*3.2e-18 10ns 2ps 2ps 100ns 120ns)
610 — dx2 b s d1
612 — .model d1 d(is=w*4e-20)
614 — mp1 d g s b p w=1 u=0.15u
616 — .ends px
```

SIMULATING A DOSE RATE EVENT IN A CIRCUIT DESIGN

FIELD

The present invention relates generally to circuit modeling, and more particularly, relates to a dose rate simulation of a transistor.

BACKGROUND

When a nuclear bomb is detonated, intense fluxes of gamma rays, x-rays, and other high energy particles are created. When integrated circuits are exposed to this type of harsh environment, a large number of electrons and holes are generated in the silicon, causing large photocurrents to be generated. Under certain conditions, these photocurrents can lead to rail-span collapse, and burnout of metal lines, contacts, and vias. This damage to the integrated circuits can ultimately result in system failure.

Some integrated circuits are designed to continue operating during and after a nuclear bomb attack or other dose rate event, such as integrated circuits used in strategic weapons systems. Dose rate hardness is a reliability parameter used for determining the hardness of these integrated circuits. The ability to predict the dose rate hardness of an integrated circuit is important for determining which integrated circuits are suitable for use in systems requiring continued operation during a dose rate event.

Dose rate hardness is typically calculated by hand. This hand calculation typically estimates total steady state photocurrent from Vdd to Vss as (dose rate)×(total collection volume). However, this method does not provide detailed nodal information (i.e., information at the nodes between Vdd and Vss). The nodal information is desirable as it can be used to provide a more complete evaluation of whether a particular device is susceptible to damage during a dose rate event.

External testing of devices to determine dose rate hardness may also be performed. For example, Military Handbook MIL-HDBK-815, Dose-Rate Hardness Assurance Guidelines, dated 7 Nov. 1994, and revised by Notice 1, dated 10 Jan. 2002, describes various hardness testing methods. However, these testing methods may be expensive and result in waste (i.e., damaged devices).

Therefore, it would be beneficial to simulate a circuit design exposed to a dose rate event to determine if the circuit meets the dose rate hardness requirements of a particular system.

SUMMARY

Subcircuit models for use in dose rate simulation are described. In one example, an NMOS transistor having a source, a drain, a body, and a gate is modeled using a subcircuit model. In addition to the NMOS transistor, the subcircuit model includes a first diode having an anode connected to the body and a cathode connected to the drain. The subcircuit model also includes a first current source that is connected in parallel with the first diode such that photocurrent due to a dose rate event flows through the first current source from the drain to the body. The first diode and the first current source provide a model of a drain junction during a dose rate event.

The subcircuit model also includes a second diode having an anode connected to the body and a cathode connected to the source. The subcircuit model also includes a second current source that is connected in parallel with the second diode such that the photocurrent due to a dose rate event flows through the second current source from the source to the body. The second diode and the second current source provide a model of a source junction during a dose rate event.

In another example, a subcircuit model is used to model an NMOS transistor in which the source and the body of the NMOS transistor are connected. In this example, only the first diode and first current source are included in the subcircuit model, which provides a model of the drain junction during a dose rate event. Modeling the source junction in this example is unnecessary.

In another example, a PMOS transistor having a source, a drain, a body, and a gate is modeled using a subcircuit model. In addition to the PMOS transistor, the subcircuit model also includes a first diode having a cathode connected to the body and an anode connected to the source. The subcircuit model also includes a first current source that is connected in parallel with the first diode such that the photocurrent due to a dose rate event flows through the first current source from the source to the body. The first diode and the first current source provide a model of a source junction during a dose rate event.

The subcircuit model also includes a second diode having a cathode connected to the body and an anode connected to the drain. The subcircuit model also includes a second current source that is connected in parallel with the second diode such that photocurrent due to a dose rate event flows through the second current source from the body to the drain. The second diode and the second current source provide a model of a drain junction during a dose rate event.

In another example, a subcircuit model is used to model a PMOS transistor in which the source and the body of the PMOS transistor are connected. In this example, only the second diode and second current source are included in the subcircuit model, which provides a model of the drain junction during a dose rate event. Modeling the source junction in this example is unnecessary.

In these examples, the strength of the diodes and the magnitude of the current sources depend on collection volume, which generally scales with transistor size and dose rate parameters. Thus, the transistor size and dose rate parameters are included in the subcircuit model. A dose rate event typically lasts a few tenths of nano-seconds, thus the dose rate parameters in the subcircuit model may describe a pulse-width of the current source as a few tenths of nano-seconds. The particular value of this pulse-width duration is not important so long as a steady state is achieved in the simulation.

The subcircuit model may be represented as a schematic or a netlist. The subcircuit model replaces transistors in a circuit design. Once the transistors in the circuit design are replaced with the subcircuit model and the rest of the circuit design is properly modeled, dose rate simulation may be performed to determine the dose rate hardness of the circuit design.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 5 depicts a netlist of a subcircuit for use in a dose rate simulation, according to one example.

DETAILED DESCRIPTION

Figure 1:
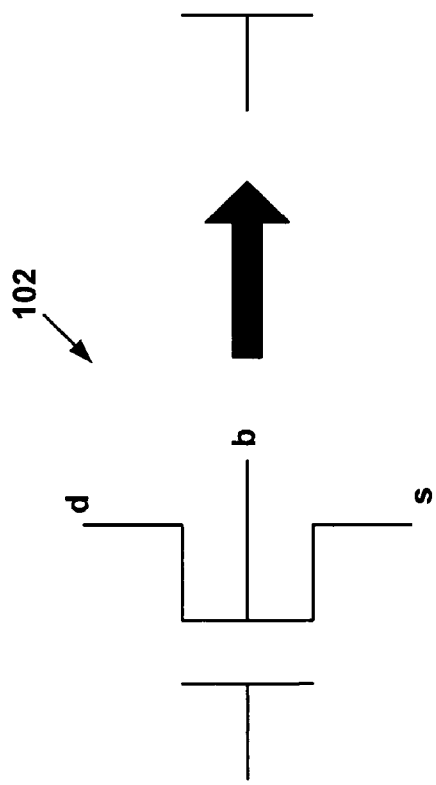
FIG. 1 depicts a circuit diagram of a subcircuit for use in a dose rate simulation, according to one example.
Figure 1:
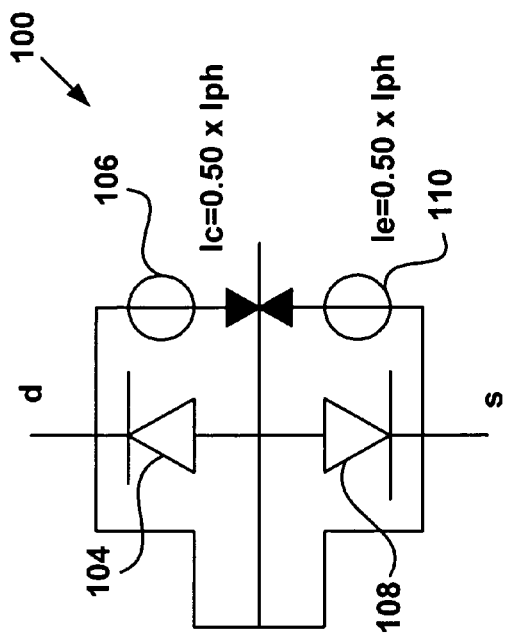

Behaviors of a transistor during a dose rate event may be modeled using a circuit simulation software package. SPICE is one of the most common of these circuit simulation programs; however, other circuit simulation programs may be used including a custom dedicated dose rate simulation program. The dose rate simulation is performed after replacing a transistor in a circuit design with a subcircuit model. The transistor may be replaced by creating a schematic-based representation of the subcircuit model or by processing an original netlist using a script. Once the transistor in the circuit design is replaced with the subcircuit, a dose rate simulation may be performed. The dose rate simulation provides current and voltage information at each node of the circuit. The results of the simulation may be used to determine the dose rate hardness of the circuit design Model Assumptions During a dose rate event, excess electron-hole pairs created in the substrate may be separated by a built-in potential in pn junctions, resulting in a photocurrent. Electrons travel from the p+ side of the junction to the n+ side of the junction, while the holes travel from the n+ side of the junction to the p+ side of the junction.

A metal-oxide semiconductor field-effect transistor (MOSFET) device includes two pn junctions, one between the source and body (source junction) and one between the drain and body (drain junction). Both the source and drain junctions participate in the collection of photocurrent. Approximately 50% of the carriers are collected by the source junction, with the remaining carriers are collected by the drain junction, independent of bias conditions. As a result, both source and drain junctions are included in the dose rate models, unless the circuit design ties the source to the body.

In some circuit designs, the source and body of a MOSFET device are tied together. In this scenario, carriers collected by the source junction do not contribute to the external current and only the carriers collected by the drain junction are included in the dose rate models. While only the drain junction is modeled, it is understood that the source junction is still a component of the MOSFET device. Approximately 50% of the carriers are collected by the drain junction in this scenario.

When a circuit includes multiple devices connected in series, the magnitude of the photocurrent depends on the weaker device in the circuit. For example, a circuit may contain a p-channel device and an n-channel device connected in series to form an inverter. In this example, the n-channel device may be smaller than the p-channel device. Accordingly, collection volume in the n-channel device may be less than the collection volume in the p-channel device. Voltage at a node located between the p-channel device and the n-channel device may change to balance the currents from each device. As a result, the photocurrent magnitude during a dose rate event depends on the collection in the n-channel device.

Bipolar amplification occurs when body current multiplied by body resistance is greater than the turn-on voltage of an emitter junction. However, the body current increases with dose rate, while the body resistance decreases with dose rate due to an increase in carrier density in the body. As a result, body current multiplied by body resistance increases much slower than previously believed. It was determined that bipolar amplification does not occur until a dose rate of $5 \times 10^{13}$ Rad/s, which is greater than a maximum dose rate requirement of $1 \times 10^{12}$ Rad/s. Thus, the dose rate models do not include bipolar amplification.

Previously it was believed that the worst case photocurrent scenario occurred during a short circuit condition (i.e., a shorted junction), which equals to Vdd/R, where R is the parasitic resistance of a Vdd and Vss network. However, it was determined that during the worst case scenario the photocurrent is actually greater due to forward biased drain junction in transistors. The subcircuit models described below take into account this understanding of the worst case scenario.

Schematic Subcircuit Models

FIG. 1 shows a SPICE implementation of a subcircuit 100 for use in replacing an NMOS transistor 102 in a circuit design. As seen in FIG. 1, a source and a body of the NMOS transistor 102 are not connected. Two diodes 104, 108 have been added to the NMOS transistor 102 to form the subcircuit 100. A diode is a device formed from a junction of n-type and p-type semiconductor material. A lead connected to the p-type material (i.e., the lead connected to a side of a triangle as seen in a diode symbol) is typically referred to as an anode, while a lead connected to the n-type material (i.e., the lead connected to a point of the triangle as seen in the diode symbol) is typically referred to as a cathode. The first and second diodes 104, 108 are used to model dark current behavior at a junction of the NMOS transistor 102 during a dose rate event.

In addition, two current sources 106, 110 have been added to the NMOS transistor 102 to form the subcircuit 100. The first and second current sources 106, 110 are used to model photocurrent behavior during a dose rate event. The combination of the first diode 104 and the first current source 106 provides a model of the drain junction of the NMOS transistor 102 during a dose rate event. The combination of the second diode 108 and the second current source 108 provides a model of the source junction of the NMOS transistor 102 during a dose rate event.

The body of the NMOS transistor 102 is connected to the anode of the first diode 104 and the drain of the NMOS transistor 102 is connected to the cathode of the first diode 104. The first current source 106 is connected in parallel with the first diode 104. Current flows through the first current source 106 from the drain to the body of the NMOS transistor 102. The current flowing through the first current source 106 is equal to approximately half of the photocurrent, which may be estimated by: (dose rate)×(collection volume). Collection volume may be estimated by the volume of lightly doped region associated with the NMOS transistor 102.

The body of the NMOS transistor 102 is connected to the anode of the second diode 108 and the source of the NMOS transistor 102 is connected to the cathode of the second diode 108. The second current source 110 is connected in parallel with the second diode 108. Current flows through the second current source 110 from the source to the body of the NMOS transistor 102. The current flowing through the second current source 110 is equal to approximately half of the photocurrent.

Figure 2:
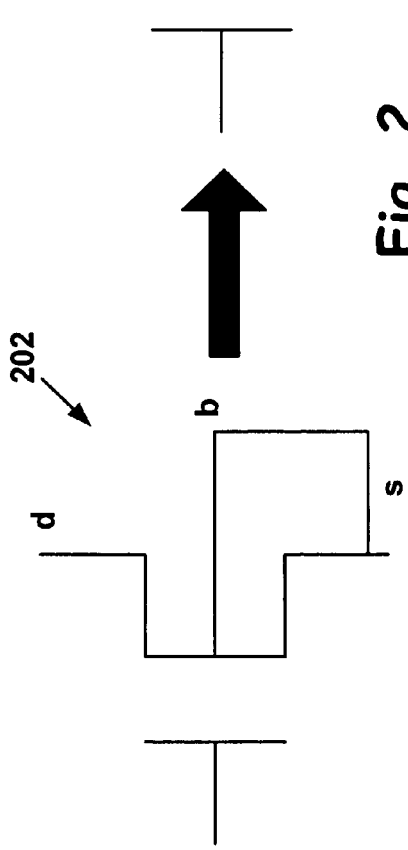
FIG. 2 depicts a circuit diagram of a subcircuit for use in a dose rate simulation, according to another example.
Figure 2:
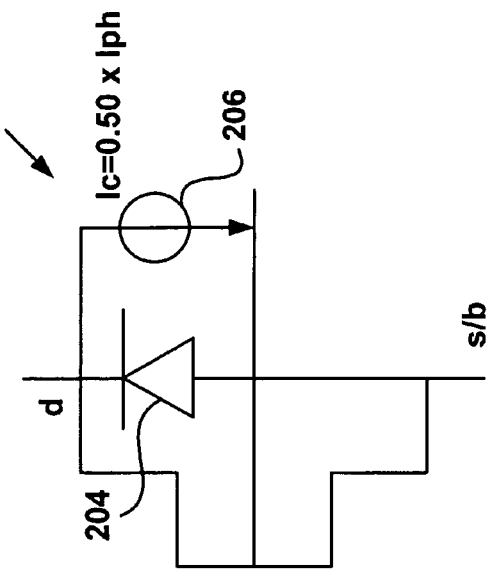

FIG. 2 shows a SPICE implementation of a subcircuit 200 for use in replacing an NMOS transistor 202 in a circuit design. As seen in FIG. 2, a source and a body of the NMOS transistor 202 are connected. A diode 204 and a current source 206 have been added to the NMOS transistor 202 to form the subcircuit 200. The combination of the diode 204 and the current source 206 provides a model of the drain junction of the NMOS transistor 202 during a dose rate event.

The body of the NMOS transistor 202 is connected to the anode of the diode 204 and the drain of the NMOS transistor 202 is connected to the cathode of the diode 204. The current source 206 is connected in parallel with the diode 204. Current flows through the current source 206 from the drain to the body of the NMOS transistor 202. The current flowing through the current source 206 is equal to approximately half of the photocurrent.

Figure 3:
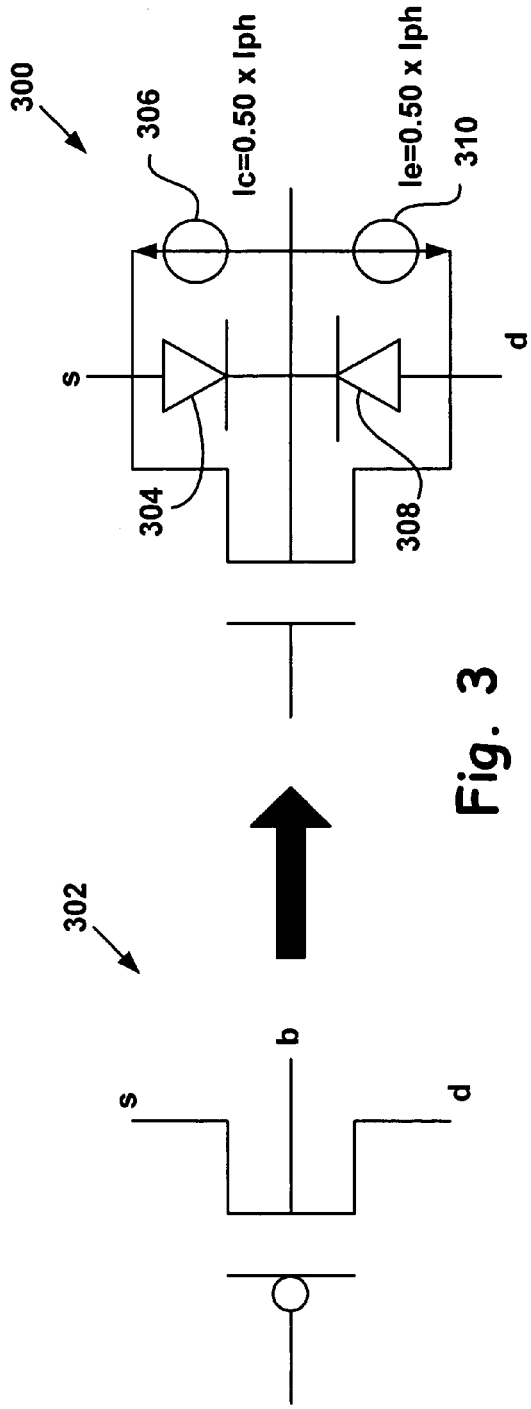
FIG. 3 depicts a circuit diagram of a subcircuit for use in a dose rate simulation, according to another example.

FIG. 3 shows a SPICE implementation of a subcircuit 300 for use in replacing a PMOS transistor 302 in a circuit design. As seen in FIG. 3, a source and a body of the PMOS transistor 302 are not connected. Two diodes 304, 308 have been added to the PMOS transistor 302 to form the subcircuit 300. The first and second diodes 304, 308 are used to model dark current behavior at a junction the PMOS transistor 302 during a dose rate event.

In addition, two current sources 306, 310 have been added to the PMOS transistor 302 to form the subcircuit 300. The first and second current sources 306, 310 are used to model photocurrent behavior during a dose rate event. The combination of the first diode 304 and the first current source 306 provides a model of the source junction the PMOS transistor 302 during a dose rate event. The combination of the second diode 308 and the second current source 308 provides a model of the drain junction the PMOS transistor 302 during a dose rate event.

The body of the PMOS transistor 302 is connected to the cathode of the first diode 304 and the source of the PMOS transistor 302 is connected to the anode of the first diode 304. The first current source 306 is connected in parallel with the first diode 304. Current flows through the first current source 306 from the source to the body of the PMOS transistor 302. The current flowing through the first current source 306 is equal to approximately half of the photocurrent.

The body of the PMOS transistor 302 is connected to the cathode of the second diode 308 and the drain of the PMOS transistor 302 is connected to the anode of the second diode 308. The second current source 310 is connected in parallel with the second diode 308. Current flows through the second current source 310 from the body to the drain of the PMOS transistor 302. The current flowing through the second current source 310 is equal to approximately half of the photocurrent.

Figure 4:
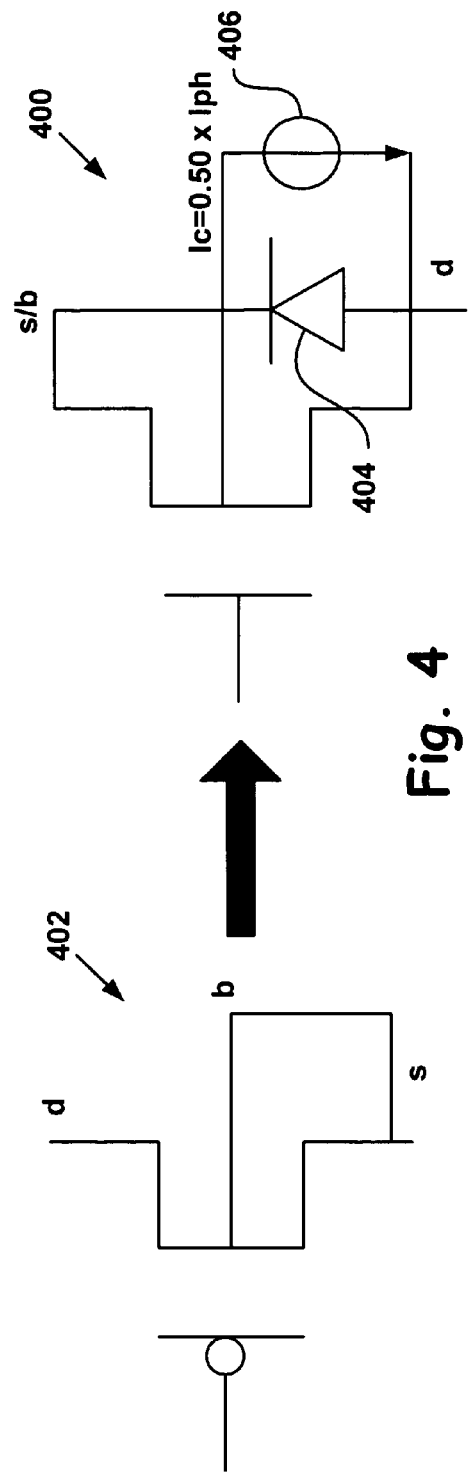
FIG. 4 depicts a circuit diagram of a subcircuit for use in a dose rate simulation, according to another example.

FIG. 4 shows a SPICE implementation of a subcircuit 400 for use in replacing a PMOS transistor 402 in a circuit design. As seen in FIG. 4, a source and a body of the PMOS transistor 402 are connected. A diode 404 and a current source 406 have been added to the PMOS transistor 402 to form the subcircuit 400. The combination of the diode 404 and the current source 406 provides a model of the drain junction the PMOS transistor 402 during a dose rate event.

The body of the PMOS transistor 402 is connected to the cathode of the diode 404 and the drain of the PMOS transistor 402 is connected to the anode of the diode 404. The current source 406 is connected in parallel with the diode 404. Current flows through the current source 406 from the body to the drain of the PMOS transistor 402. The current flowing through the current source 406 is equal to approximately half of the photocurrent.

The strength of the diodes and the magnitude of the current sources depend on transistor size and dose rate event parameters, and are represented as functions of transistor size and dose rate parameters in the subcircuit model. As described previously, the photocurrent depends upon the weakest device connected in series.

For the schematic subcircuit models shown in FIGS. 1-4, transistor size information (e.g., width and length of the transistor) and dose rate may be incorporated into the schematic representations as properties of the subcircuit. Adding properties to a device or subcircuit is a standard feature in most computer-aided design (CAD) tools. While FIGS. 1-4 provide subcircuit model examples for NMOS and PMOS transistors, other devices may be modeled in a similar fashion.

Netlist Subcircuit Models

FIG. 5 shows an example netlist 500 for an n-channel device. The first line 502 defines the subcircuit, nx, as having a drain (d), gate (g), source (s), and body (b). The subcircuit, nx, includes two diodes (dx1 and dx2), two current sources (In1 and In2), and an NMOS transistor (mn1). The second line 504 defines the first current source In1 as being connected from the drain to the body (i.e., current flow from the drain to the body). The second line 504 further describes parameters of the photocurrent based on the dose rate. The third line 506 defines first diode, dx1, as being connected from the body to the drain.

The fourth line 508 defines the second current source In2 as being connected from the source to the body (i.e., current flow from the source to the body). The fourth line 508 further describes parameters of the photocurrent based on the dose rate. The fifth line 510 defines second diode, dx2, as being connected from the body to the source. The sixth line 512 further describes parameters of the diodes, dx1 and dx2.

The seventh line 514 defines the NMOS transistor, mn1. The NMOS transistor, mn1, includes a drain, gate, source, and body. The size (i.e., width and length) of the NMOS transistor is also defined in the seventh line 514. The final line 516 ends the subcircuit model, nx. The function of the subcircuit model, nx, is similar to the schematic subcircuit model 100 depicted in FIG. 1. The parameters used in the subcircuit, nx, are technology dependent and may need to be modified for other technologies.

Figure 6:
FIG. 6 depicts a netlist of a subcircuit for use in a dose rate simulation, according to another example.

FIG. 6 shows an example netlist 600 for a p-channel device. The first line 602 defines the subcircuit, px, as having a drain (d), gate (g), source (s), and body (b). The subcircuit, px, includes two diodes (dx1 and dx2), two current sources (Ip1 and Ip2), and a PMOS transistor (mp1). The second line 604 defines the first current source Ip1 as being connected from the body to the drain (i.e., current flow from the body to the drain). The second line 604 further describes parameters of the photocurrent based on the dose rate. The third line 606 defines first diode, dx1, as being connected from the drain to the body.

The fourth line 608 defines the second current source Ip2 as being connected from the body to the source (i.e., current flow from the body to the source). The fourth line 608 further describes parameters of the photocurrent based on the dose rate. The fifth line 610 defines second diode, dx2, as being connected from the source to the body. The sixth line 612 further describes parameters of the diodes, dx1 and dx2.

The seventh line 614 defines the PMOS transistor, mp1. The PMOS transistor, mp1, includes a drain, gate, source, and body. The size (i.e., width and length) of the PMOS transistor is also defined in the seventh line 614. The final line 616 ends the subcircuit model, px. The function of the subcircuit model, px, is similar to the schematic subcircuit model 300 depicted in FIG. 3. The parameters used in the subcircuit, px, are technology dependent and may need to be modified for other technologies.

SUMMARY

The subcircuit models described in FIGS. 1-6 can be used to replace transistors in a circuit design with a standard subcircuit call in a computer simulation. Transistor size and dose rate parameters are included in the subcircuit models. This dose rate simulation method provides detailed information of current and voltage at each node in the circuit. By making the dose rate simulation a standard call in a circuit simulation software package, dose rate hardness can be easily and accurately determined.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method of using a subcircuit model for dose rate simulation of a circuit design, comprising in combination:
   replacing an NMOS transistor in a circuit design with a subcircuit model, wherein the subcircuit model includes:
   an NMOS transistor having a source, a drain, a body, and a gate;
   a first diode having an anode connected to the body and a cathode connected to the drain;
   a first current source connected in parallel with the first diode, wherein current flows through the first current source from the drain to the body, and wherein the first diode and the first current source provide a model of a drain junction during a dose rate event;
   a second diode having an anode connected to the body and a cathode connected to the source;
   a second current source connected in parallel with the second diode, wherein current flows through the second current source from the source to the body, and wherein the second diode and the second current source provide a model of a source junction during the dose rate event;
   an NMOS transistor size parameter;
   a dose rate parameter of the dose rate event; and
   performing a computer simulation of the circuit design to determine dose rate hardness of the circuit design.

2. The subcircuit model of claim 1, wherein the subcircuit model is a schematic-based representation of a circuit.

3. The subcircuit model of claim 1, wherein the subcircuit model is a netlist representation of a circuit.

4. A method of using a subcircuit model for dose rate simulation of a circuit design, comprising in combination:
   replacing an NMOS transistor in a circuit design with a subcircuit model, wherein the subcircuit model includes:
   an NMOS transistor having a source, a drain, a body, and a gate, wherein the source and the body are connected;
   a diode having an anode connected to the body and a cathode connected to the drain; and
   a current source connected in parallel with the diode, wherein current flows through the current source from the drain to the body, and wherein the diode and the current source provide a model of a drain junction during a dose rate event;
   an NMOS transistor size parameter;
   a dose rate parameter of the dose rate event; and
   performing a computer simulation of the circuit design to determine dose rate hardness of the circuit design.

5. The subcircuit model of claim 4, wherein the subcircuit model is a schematic-based representation of a circuit.

6. The subcircuit model of claim 4, wherein the subcircuit model is a netlist representation of a circuit.

7. A method of using a subcircuit model for dose rate simulation of a circuit design, comprising in combination;
   replacing a PMOS transistor in a circuit design with a subcircuit model, wherein the subcircuit model includes:
   a PMOS transistor having a source, a drain, a body, and a gate;
   a first diode having a cathode connected to the body and an anode connected to the source;
   a first current source connected in parallel with the first diode, wherein current flows through the first current source from the body to the source, and wherein the first diode and the first current source provide a model of a source junction during a dose rate event;
   a second diode having a cathode connected to the body and an anode connected to the drain; and
   a second current source connected in parallel with the second diode, wherein current flows through the second current source from the body to the drain, and wherein the second diode and the second current source provide a model of a drain junction during the dose rate event;
   a PMOS transistor size parameter;
   a dose rate parameter of the dose rate event; and
   performing a computer simulation of the circuit design to determine dose rate hardness of the circuit design.

8. The subcircuit model of claim 7, wherein the subcircuit model is a schematic-based representation of a circuit.

9. The subcircuit model of claim 7, wherein the subcircuit model is a netlist representation of a circuit.

10. A method of using a subcircuit model for dose rate simulation of a circuit design, comprising in combination:
    replacing a PMOS transistor in a circuit design with a subcircuit model, wherein the subcircuit model includes:
    a PMOS transistor having a source, a drain, a body, and a gate, wherein the source and the body are connected;
    a diode having a cathode connected to the body and an anode connected to the drain; and a current source connected in parallel with the diode, wherein current flows through the current source from the body to the drain, and wherein the diode and the current source provide a model of a drain junction during a dose rate event;

a PMOS transistor size parameter;

a dose rate parameter of the dose rate event; and performing a computer simulation of the circuit design to determine dose rate hardness of the circuit design.

11. The subcircuit model of claim 10, wherein the subcircuit model is a schematic-based representation of a circuit.

12. The subcircuit model of claim 10, wherein the subcircuit model is a netlist representation of a circuit.

13. A method for simulating a dose rate event in a circuit design comprising in combination;

replacing a transistor in the circuit design with a subcircuit, wherein the subcircuit includes a drain junction model that models photocurrent collection at a drain junction of the transistor during a dose rate event, a source junction model that models photocurrent collection at a source junction of the transistor during the dose rate event, size of the transistor, and dose rate of the dose rate event; and performing a computer simulation of the circuit design to determine dose rate hardness of the circuit design.

14. The method of claim 13, wherein the drain junction model includes a first diode connected in parallel with a first current source.

15. The method of claim 13, wherein the source junction model includes a second diode connected in parallel with a second current source.

16. The method of claim 13, wherein the transistor is an NMOS transistor.

17. The method of claim 13, wherein the transistor is a PMOS transistor.

18. The method of claim 13, wherein replacing the transistor in the circuit design with a subcircuit includes replacing the transistor with a schematic-based representation of the subcircuit.

19. The method of claim 13, wherein replacing the transistor in the circuit design with a subcircuit includes replacing the transistor with a netlist representation of the subcircuit.

20. The method of claim 13, wherein performing the computer simulation includes calculating voltage and current at each node of the transistor.

21. A system for simulating a dose rate event in a circuit design, comprising in combination:

a processor;

data storage; and machine language instructions stored in the data storage executable by the processor to:

replace a transistor in the circuit design with a subcircuit, wherein the subcircuit includes a drain junction model that models photocurrent collection at a drain junction of the transistor during a dose rate event, a source junction model that models photocurrent collection at a source junction of the transistor during the dose rate event, size of the transistor, and dose rate of the dose rate event; and perform a computer simulation of the circuit design.

22. The system of claim 21, wherein the performing a computer simulation includes determining dose rate hardness of the circuit design.

23. The system of claim 21, wherein the performing a computer simulation includes calculating voltage and current at each node of the transistor.

* * * * *

UNITED STATES PATENT AND TRADEMARK OFFICE
CERTIFICATE OF CORRECTION

PATENT NO. : 7,322,015 B2  
APPLICATION NO. : 11/029308  
DATED : January 22, 2008  
INVENTOR(S) : Harry H. L. Liu et al.

Page 1 of 1

It is certified that error appears in the above-identified patent and that said Letters Patent is hereby corrected as shown below:

Please replace the Assignee Item (73) on the Title Page with:

Honeywell International Inc.,

Morristown, NJ (US)

Signed and Sealed this

Twentieth Day of May, 2008

JON W. DUDAS  
*Director of the United States Patent and Trademark Office*